United States Patent [19]

Kondow et al.

[11] 4,281,386
[45] Jul. 28, 1981

[54] SYSTEMS FOR DETECTING FAULTS IN ELECTRIC POWER SYSTEMS

[75] Inventors: Ryotaro Kondow, Fuchu; Eiichi Okamoto, Tokyo, both of Japan

[73] Assignee: Tokyo Shibaura Denki Kabushiki Kaisha, Kanagawa, Japan

[21] Appl. No.: 62,622

[22] Filed: Aug. 1, 1979

[51] Int. Cl.$^3$ ...................... G06F 15/20; G01R 31/08
[52] U.S. Cl. .................................. 364/492; 364/482; 361/79; 324/52
[58] Field of Search ............... 364/482, 483, 494, 492, 364/493; 361/79, 80; 324/52

[56] References Cited

U.S. PATENT DOCUMENTS

| | | | |
|---|---|---|---|
| 3,931,502 | 1/1976 | Kohlas | 364/492 |
| 4,107,778 | 8/1978 | Nii et al. | 364/492 |

*Primary Examiner*—Edward J. Wise

*Attorney, Agent, or Firm*—Stevens, Davis, Miller & Mosher

[57] ABSTRACT

The method and the system are for detecting a current $\dot{I}$ and a voltage $\dot{V}$ of the electric power system and judging that there is fault if:

$$||\dot{V}-\dot{I}e^{j\phi}|\dot{V}|/|\dot{I}||<k_o$$

is fulfilled, where $k_o$ represents a constant and $\dot{I}e^{j\phi}$ an electrical quantity obtained by shifting the current $\dot{I}$ by a predetermined angle $\phi$. In a modified form, the expression $$|\dot{V}-\dot{I}e^{j\phi}X|<k_o$$

is used, where X equals to $|\dot{V}|/|\dot{I}|$ or Z (a predetermined line impedance) whichever is smaller.

4 Claims, 7 Drawing Figures

SYSTEMS FOR DETECTING FAULTS IN ELECTRIC POWER SYSTEMS

BACKGROUND OF THE INVENTION

The present invention relates to a system for detecting a fault such as a shortcircuit in an electric power system, and more particularly to a system for a current compensation type under-voltage detection.

A current compensation type under-voltage detection system having a characteristic shown in FIG. 1 is advantageous in distinguishing between a fault and a normal load condition; i.e., between a condition wherein a fault is present in the electric power system and a condition wherein there is no fault and the electric power system is connected to the load. The current compensation type under-voltage detection system is therefore widely employed as a fault detection system. The characteristic shown in FIG. 1 has been realized by a transistor type relay, as described in Japanese patent application publication No. 21,395/1964 (Japanese Pat. No. 440,087).

Recent development in digital technology has enabled use of a digital arithmetic operation device in a relaying system. In such a digital relaying system, electrical quantities such as currents and voltages in an electric power system are detected at a prescribed interval, and digitized, and are then applied as digital data to a digital operation device. The digital operation device performs arithmetical and logical operations on the applied data, in accordance with a program, to make judgements necessary to operate relaying devices. However, it has hitherto been impossible to realize a relaying system having a characteristic similar to that shown in FIG. 1. The reason for this is that the characteristic shown in FIG. 1 is closely related to the principle of judgement of a transistor type relaying system, which detects the instantaneous maximum value of the electrical quantity, as described in Japanese patent application publication No. 21,395/1964, while in a digital relaying system, the electrical quantities are sampled at certain intervals and are supplied to the digital operation device, thus making it difficult to determine accurately the instantaneous maximum value of the electrical quantity.

SUMMARY OF THE INVENTION

An object of the invention is to provide a system for current compensation type under-voltage detection wherein the instantaneous maximum value of the electrical quantity in an electric power transmission system is not used but electrical quantities expressed in vector are used.

According to one aspect of the invention, there is provided a method for detecting a fault in an electric power system of the type wherein the fault is detected by using a current and a voltage of the electric power system, characterized in that the method comprises the steps of: detecting a current $\dot{I}$ and a voltage $\dot{V}$ of the electric power system, and judging that there is a fault in the electric power system if the expression:

$$\left| \dot{V} - \dot{I}e^{j\phi} \frac{|\dot{V}|}{|\dot{I}|} \right| < k_o$$

is fulfilled, where $k_o$ represents a constant and $\dot{I}e^{j\phi}$ an electrical quantity obtained by shifting the current $\dot{I}$ by a predetermined angle $\phi$.

According to a modification of the invention, there is provided a method for detecting a fault in an electric power system of the type wherein the fault is detected by using a current and a voltage of the electric power system, characterized in that the method comprises the steps of: detecting a current I and a voltage V of the electric power system, and judging that there is a fault in the electric power system if the following pair of expressions are satisfied:

$$|V|/|I| < Z$$

and $$\left| \dot{V} - \dot{I}e^{j\phi} \frac{|\dot{V}|}{|\dot{I}|} \right| < k_o$$

or $$|V|/|I| > Z$$

and $$|V - Ie^{j\phi}Z| < k_o,$$

where $k_o$ represents a constant, $Ie^{j\phi}$ an electrical quantity obtained by shifting the current I by a predetermined angle $\phi$, and Z a predetermined line impedance.

According to another aspect to the invention, there is provided a system for detecting a fault in an electric power system of the type wherein the fault is detected by using a current and a voltage of the electric power system, characterized in that the system comprises: means for detecting a current I and a voltage V of the electric power system, and means for judging that there is a fault in the electric power system if the expression:

$$\left| \dot{V} - \dot{I}e^{j\phi} \frac{|\dot{V}|}{|\dot{I}|} \right| < k_o$$

is fulfilled, where $k_o$ represents a constant and $Ie^{j\phi}$ an electrical quantity obtained by shifting the current I by a predetermined angle $\phi$.

According to a modification of the invention, there is provided a system for detecting a fault in an electric power system of the type wherein the fault is detected by using a current and a voltage of the electric power system, characterized in that the system comprises: means for detecting a current $\dot{I}$ and voltage $\dot{V}$ of the electric power system, and means for judging that there is a fault in the electric power system if the following pair of expressions are satisfied:

$$|\dot{V}|/|\dot{I}| < Z$$

and $$\left| \dot{V} - \dot{I}e^{j\phi} \frac{|\dot{V}|}{|\dot{I}|} \right| < k_o$$

or $$|V|/|I| > Z$$

and $$|V - Ie^{j\phi}Z| < k_o,$$

where $k_o$ represents a constant, $\dot{I}e^{j\phi}$ an electrical quantity obtained by shifting the current $\dot{I}$ by a predetermined angle $\phi$, and Z a predetermined line impedance.

DESCRIPTION OF THE PREFERRED EMBODIMENTS

Figure 2:
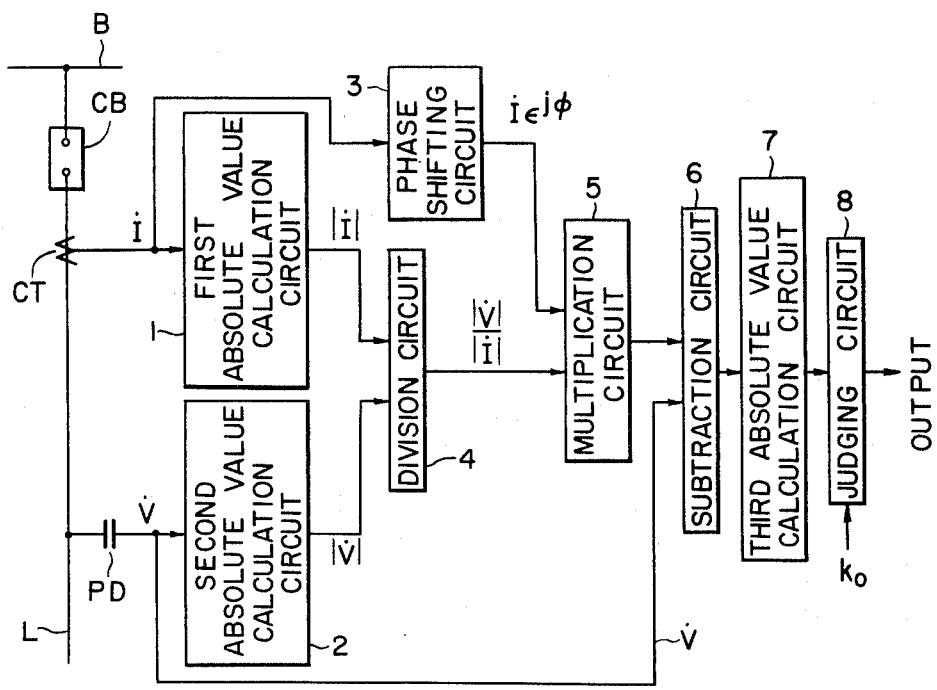
FIG. 2 is a block diagram showing one embodiment of a fault detection system according to the invention.

FIG. 2 shows one embodiment of the invention. An electric power system comprises a bus bar B from which a transmission line L to be protected is branched. At the branch point, a circuit breaker CB is installed.

A potential transformer PD steps down the voltage of the transmission line L to a corresponding value $\dot{V}$ (in terms of a vector) of a prescribed level. Similarly, a current transformer CT transforms the current flowing through transmission line L to a corresponding value $\dot{I}$ (in terms of a vector) of a prescribed level. A first absolute value calculation circuit 1 calculates the absolute value $|\dot{I}|$ of the current $\dot{I}$. A second absolute value calculation circuit 2 calculates the absolute value $|\dot{V}|$ of the voltage $\dot{V}$. A phase shifting circuit 3 receives the current $\dot{I}$ and shifts the phase thereof by an angle $\phi$ to produce $\dot{I}e^{j\phi}$. A division circuit 4 receives the outputs of the absolute value calculation circuits 1 and 2 to produce $|\dot{V}|/|\dot{I}|$. A multiplication circuit 5 receives the outputs of the phase shifting circuit 3 and the division circuit 4 and performs a multiplication operation to produce $\dot{I}e^{j\phi}|\dot{V}|/|\dot{I}|$. The circuits 1, 2, 3, 4 and 5, in combination form a device for providing a quantity having an absolute value equal to that of the detected voltage and having a phase in advance of the detected current by the angle $\phi$. A subtraction circuit 6 receives the outputs of the multiplication circuit 5 and the potential transformer PD and performs a subtraction operation to produce $\dot{V} - \dot{I}e^{j\phi}|\dot{V}|/|\dot{I}|$. A third absolute value calculation circuit 7 is provided to calculate the absolute value $|\dot{V} - \dot{I}e^{j\phi}|\dot{V}|/|\dot{I}||$ of the output of the subtraction circuit 6. A judging circuit 8 compares the output of the third absolute value calculation circuit 7 with a predetermined reference value $k_o$, and judges that there is a fault in the protected transmission line L if the output of the circuit 7 is smaller than $k_o$, i.e., if the following expression is satisfied:

$$|\dot{V} - \dot{I}e^{j\phi}|\dot{V}|/|\dot{I}|| < k_o \tag{1}$$

The left side of the expression (1) is equivalent to:

$$|\dot{V} - \dot{V}e^{j(\phi-\theta)}| \tag{1a}$$

where $\theta$ represents a phase difference between V and I. The expression (1a) can be modified to:

$$2 \cdot \left| \dot{V} \sin \frac{\phi - \theta}{2} \right| \tag{1b}$$

Accordingly, the expression (1) can be rewritten as follows:

$$\left| \dot{V} \sin \frac{\phi - \theta}{2} \right| < \frac{k_o}{2} \tag{2}$$

Figure 3:
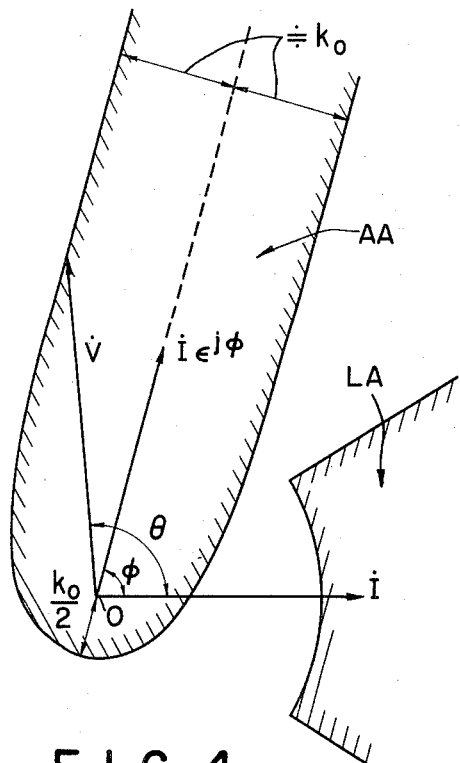
FIG. 3 is a graph showing operating characteristic of the embodiment shown in FIG. 2.

The characteristic of the expression (2) is illustrated in FIG. 3.

If $\phi$ is selected to be equal to the impedance angle of the transmission line, the phase of $\dot{V}$ would be substantially equal to the phase of $\dot{I}e^{j\phi}$ when there is a fault in the transmission line, so that $\dot{V}$ falls within the operating area indicated by AA. If there is no fault on the transmission line and the load, $\dot{V}$ falls within the load area indicated by LA. It is therefore possible to distinguish between the fault situation in which there is a fault in the transmission line and the no fault situation. If the expression (1) is satisfied or the operation condition is met, the associated relaying device, not shown, is actuated and the circuit breaker CB is tripped.

Figure 4:
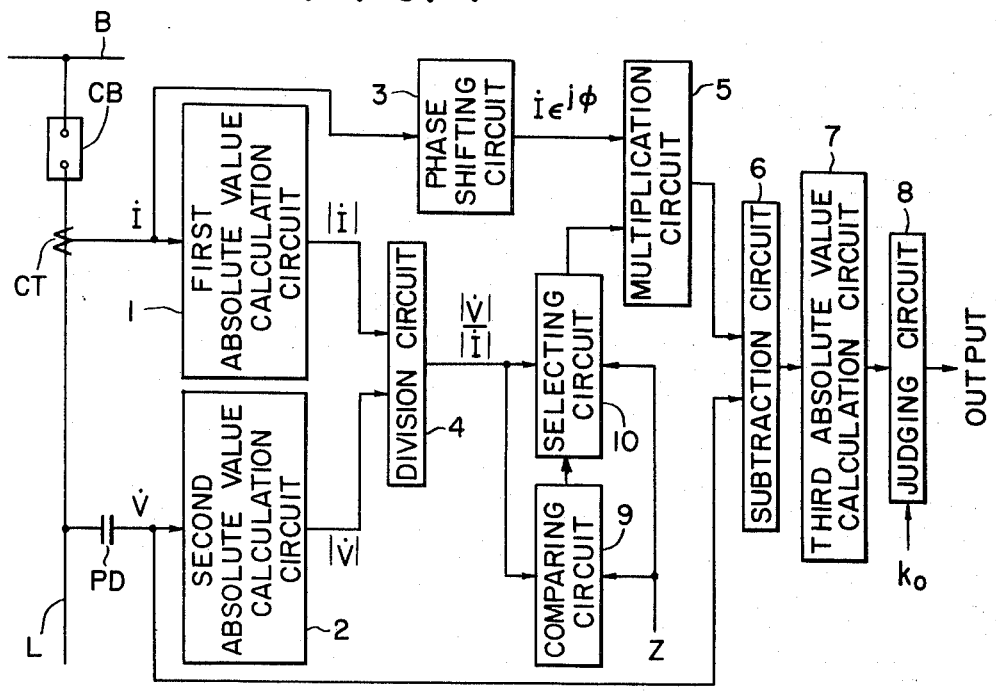
FIG. 4 is a block diagram showing another embodiment of the invention.

FIG. 4 shows another embodiment of the invention, which is similar to the embodiment shown in FIG. 2, except that a comparing circuit 9 and a selecting circuit 10 are inserted between the division circuit 4 and a multiplication circuit 5. The comparing circuit 9 compares the output $|\dot{V}|/|\dot{I}|$ with a predetermined constant Z. The selecting circuit 10 is responsive to the result of the comparison at the comparing circuit 9 and selects either $|\dot{V}|/|\dot{I}|$ or Z whichever has been found smaller. The selected value $X(|\dot{V}|/|\dot{I}|$ or Z) is fed to the multiplication circuit 5 and is subjected to a similar processing as described with reference to FIG 2.

Accordingly, the judgement made at the judging circuit 8 is to find whether the following expression is satisfied or not:

$$|\dot{V} - \dot{I}e^{j\phi}X| < k_o,$$

where X is $|\dot{V}|/|\dot{I}|$ or Z whichever is smaller. This means that the system makes a judgement whether the following pairs of expressions hold or not.

$$\left. \begin{array}{l} |\dot{V}|/|\dot{I}| < Z \\ \text{and} \\ |\dot{V} - \dot{I}e^{j\phi}|\dot{V}|/|\dot{I}|| \quad k_o \end{array} \right\} \tag{3}$$

or $$\left. \begin{array}{l} |\dot{V}|/|\dot{I}| > Z \\ \text{and} \\ |\dot{V} - \dot{I}e^{j\phi}Z| < k_o \end{array} \right\} \tag{4}$$

Figure 1:
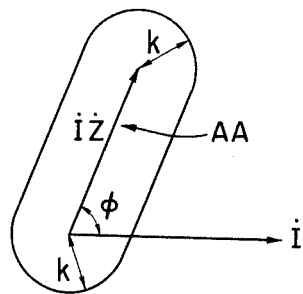
FIG. 1 is a graph showing operating characteristic of a conventional current compensation type under-voltage detection system.
Figure 5:
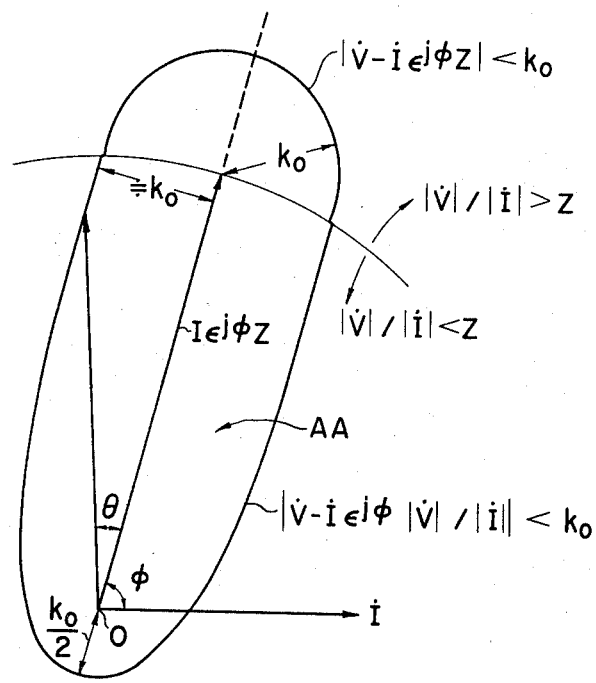
FIG. 5 is a graph showing operating characteristic of the embodiment shown in FIG. 4.

If the pair of expression (3) or (4) are satisfied, it is judged that there is a fault in the power system. The characteristic is shown in FIG. 5. It will be seen that under-voltage at a point spaced from bus bar B by a distance corresponding to the line impedance Z can be detected with an accuracy of $k_o$ and undervoltage within a protected region, i.e., a fault in the power system can be detected. It will also be seen that the characteristic shown in FIG. 5 is quite similar to that shown in FIG. 1.

The operating condition used in the embodiment of FIG. 2 is specified by the expression (1). However, it should be noted that the expression (1) may be rewritten or modified in various ways. For instance, it can be rewritten as follows:

$$||\dot{I}|\cdot\dot{V}-|\dot{V}|\cdot\dot{I}e^{j\phi}|<k_{o'}|\dot{I}|| \quad (5)$$

So, the arrangement shown in FIG. 2 may be modified to perform judgement whether the expression (5) is fulfilled or not. The expressions (3) and (4) may be similarly modified, and the arrangement shown in FIG. 4 may be modified accordingly. For instance, the comparing circuit 9 and the selecting circuit 10 may be modified to select either $|\dot{V}|/|\dot{I}|$ of Z depending on whether $|\dot{I}|\cdot Z$ is larger or smaller than $|\dot{V}|$. Therefore, the above recitation of providing a quantity having an absolute value equal to that the detected voltage and having a phase in advance of the detected current by the predetermined line impedance angle should be construed to encompass providing a quantity with a coefficient (which may be a variable or constant) where the detected voltage is also multiplied by the same coefficient.

It should also be understood that the output of the system indicating that there is a fault may be processed further or combined with some other signals defining line conditions to recognize a fault in the area protected by the particular relaying system. For instance, the output of the system shown in FIG. 2 may be combined with an output signal of a distance relay indicating that the line impedance corresponding to the distance from the relay to the fault point is smaller than a predetermined line impedance corresponding to the distance from the relay to the limit of the protected area in such a manner that if both signals are present it is judged that there is a fault in the protected area. Therefore, the recitation in the claims that the circuit breaker is tripped in accordance with the fault detection signal from the detection system illustrated should be construed to encompass various arrangements in which the fault detection signal is combined with other signals before making a final decision for tripping the circuit breaker.

The invention has been described with reference to embodiments in which the detected electrical quantities are processed in analog devices, to judge whether the operating condition is satisfied or not. However, the invention also is applicable to a system in which digital operations are performed to process the detected electrical quantities.

Figure 6:
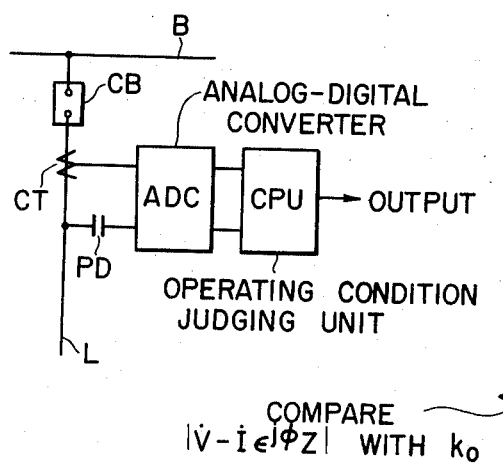
FIG. 6 is a block diagram showing still another embodiment of the invention.

FIG. 6 shows still another embodiment in which the detected electrical quantities are subjected to digital processing. As illustrated, the current $\dot{I}$ and the voltage $\dot{V}$ of the transmission line L are digitized in an analog-digital converter ADC and are then fed to an operating condition judging unit CPU. The operating condition judging unit CPU may be constructed of a digital operation unit such as a microcomputer which processes, in accordance with a program, the digitized electrical quantities such as the current and the voltage.

Figure 7:
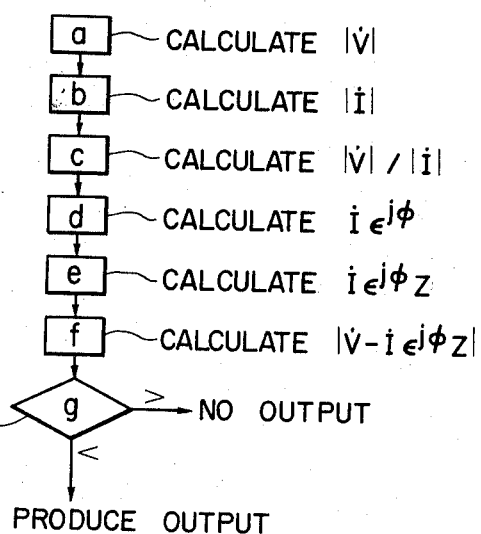
FIG. 7 is a flowchart showing the operation of the embodiment shown in FIG. 6.

FIG. 7 shows a flow chart illustrating the processing by the operating condition judging unit CPU. The steps a-g correspond to the operations performed by the circuits 1-8 shown in FIG. 2.

What is claimed is:

1. In a protective relay system in which a fault in an electric power system is detected using a current and a voltage of the electric power system, and a circuit breaker provided in the electric power system is tripped in accordance with the fault detection, the improvement which comprises:

first means for detecting a current and a voltage of the electric power system, second means responsive to the detected current and the detected voltage for producing a first quantity having an absolute value equal to that of said detected voltage and having a phase in advance of said detected current by a predetermined impendance angle of the electric power system, third means responsive to said detected voltage and said first quantity for obtaining the absolute value of the difference between said voltage and said first quantity, and fourth means responsive to said absolute value from said third means for comparing it with a predetermined constant and producing a fault detection signal if, as a result of the comparison, said absolute value is found to be smaller than said constant, said circuit breaker being tripped in accordance with said fault detection signal.

2. A system as set forth in claim 1 wherein said second means comprises:

first absolute value calculation means for calculating an absolute value of said detected current, second absolute value calculation means for calculating an absolute value of said detected voltage, phase shifting means connected to receive said detected current for shifting the phase of said detected current by said impedance angle, division means connected to receive said absolute value of said detected current and said absolute value of said detected voltage for obtaining a ratio of said absolute value of said detected voltage to said absolute value of said detected current, and multiplying means connected to receive the output of said phase shifting means and the output of said division means for obtaining the product thereof, said product being used as the output of said second means.

3. A system as set forth in claim 1, wherein said second means compares a ratio of the absolute value of said detected voltage to the absolute value of said detected current with a predetermined line impedance and produces a second quantity in place of said first quantity having an absolute value equal to that of a product of said detected current and said line impedance angle when said ratio is larger than said line impedance, wherein said first quantity is produced only when said ratio is not larger than said line impedance.

4. A system as set forth in claim 3 wherein said second means comprises:

first absolute value calculation means for calculating an absolute value of said detected current, second absolute value calculation for calculating an absolute value of said detected voltage, phase shifting means connected to receive said detected current for shifting the phase of said detected current by said impedance angle, division means connected to receive said absolute value of said detected current and said absolute value of said detected voltage for obtaining a ratio of said absolute value of said voltage to said absolute value of said detected current, comparing means for comparing the output of said division means with said line impedance, selecting means responsive to the result of the comparison of said comparing means for producing a value which is equal to said output of said division means or said line impedance whichever is smaller, and multiplication means responsive to the output of said phase shifting means and the output of said selecting means for obtaining a product thereof, said product being used as the output of said second means.

* * * * *